United States Patent [19]

Bansemir et al.

[11] 4,401,710

[45] Aug. 30, 1983

[54] SOLAR CELL CARRIER MEMBRANE COMPRISING A FABRIC COMPOSED OF PLASTIC BANDS REINFORCED BY ARAMIDE FIBERS

[75] Inventors: Horst Bansemir, Munich; Wolfgang Buchs, Valley, both of Fed. Rep. of Germany

[73] Assignee: Messerschmitt-Bölkow-Blohm Gesellschaft mit beschrankter Haftung, Munich, Fed. Rep. of Germany

[21] Appl. No.: 356,291

[22] Filed: Mar. 10, 1982

[30] Foreign Application Priority Data

Mar. 17, 1981 [DE] Fed. Rep. of Germany ....... 3110302

[51] Int. Cl.³ .................... B32B 27/02; B32B 27/08; B32B 27/12; B32B 27/34
[52] U.S. Cl. .................................. 428/229; 136/245; 136/292; 428/109; 428/114; 428/258; 428/473.5; 428/474.7
[58] Field of Search ............... 428/109, 114, 229, 258, 428/473.5, 474.7; 136/245, 292

[56] References Cited

U.S. PATENT DOCUMENTS 3,993,829 11/1976 Park .................................. 428/257
4,043,834 8/1977 Rusch ................................. 136/245

FOREIGN PATENT DOCUMENTS 2160345 5/1973 Fed. Rep. of Germany .
2923535 12/1980 Fed. Rep. of Germany .

OTHER PUBLICATIONS

Rusch, Proc. European Symp. on Photovoltaic Generators in Space (ESTEC, Noordwijk, Sep. 11–13 1978), ESA SP-140 (Nov. 1978), pp. 41–48.

Primary Examiner—James C. Cannon
Attorney, Agent, or Firm—Toren, McGeady and Stanger

[57] ABSTRACT

A carrier membrane supports area covering solar cells and, preferably, is used for energy supply on a spacecraft. The membrane is stretched in a frame between two opposite sides and consists of plastic sheeting covered by a fiber-reinforced plastic fabric. To save weight, prevent insulation problems and thereby increase service reliability, the fabric is made of plastic reinforced with aromatic polyamide fibers in the form of woven crossing bands. The bands extend in the direction in which the membrane is stretched and transversely of the stretched direction. The bands extending in the stretched direction provide greater surface coverage than the bands extending transversely to 11 Claims, 2 Drawing Figures

SOLAR CELL CARRIER MEMBRANE COMPRISING A FABRIC COMPOSED OF PLASTIC BANDS REINFORCED BY ARAMIDE FIBERS

SUMMARY OF THE INVENTION

The present invention is directed to a solar cell carrier membrane stretched between two opposite sides of a frame with the membrane being made up of plastic sheeting covered with a fabric formed of fiber-reinforced plastic.

Such a carrier membrane is known, note German Offenlegungsshrift No. 29 23 535. The membrane is made up of a 25 μm thick polyimide sheeting reinforced with a fiber-reinforced plastic, that is, a carbon fiber fabric. The membrane is stretched from two opposite sides by cup spring arrangements in a frame made of a composite fiber material. The carrier membrane is used with solar generators on a spacecraft. The area covering solar cells are applied on the opposite side of the plastic sheeting from the one covered by the carbon fiber fabric.

A variety of requirements must be met by solar cell carrier membranes such as used to supply power in synchronous satellites. One requirement is that the membrane should be as light in weight as possible and another requirement is that it maintain a certain mechanical stability. Since considerable temperature differences occur during orbits of a spacecraft circling the region of the equator due to the continuously occurring shading by the earth, the membrane must be constructed so that the stresses developed between the frame and the membrane do not become too great. Accordingly, the frames are often produced from carbon fiber-reinforced plastic, because such material possesses a relatively low thermal coefficient of expansion. While the carbon fiber fabric reinforcing the plastic sheeting of the membrane is a material of the same type, the thermal coefficient of expansion of the special type of fiber used is so much greater than that of the frame material that considerable thermal stressing takes place. Moreover, the plastic sheeting of the membrane serving as base for the solar cells must provide an adequate insulating effect which requires a certain minimum thickness of the plastic sheeting when the electrically conductive carbon fiber fabric is used. Therefore, the need exists to meet the above requirements in an improved manner which is technically adequate and low cost.

Therefore, the primary object of the present invention is to construct the solar cell carrier membrane of the type described above so that it is economical and reliable in service and this is effected in particular by reducing the weight of the membrane, the thermal stresses, and the material and testing expenditures connected with the insulation feature.

In accordance with the present invention, the fabric applied to the plastic sheeting is made up of woven crossing bands made of plastic reinforced with aromatic polyamide fibers. One set of bands extends in the direction in which the membrane is stretched and the other set of fibers extends transversely of the first set. The surface coverage afforded by the bands extending in the stretching direction is higher than that of the transversely extending bands.

Initially, utilizing the present invention, there is a considerable reduction in the thermal stresses developed in the carrier membrane. The thermal coefficient of expansion of the bands incorporating aromatic polyamide fibers is only about $1.3 \times 10^{-6} K^{-1}$ as compared to the carbon fiber reinforced fabric which has a value of $3.5 \times 10^{-6} K^{-1}$. The difference compared to the thermal coefficient of expansion of the frame, which in the case of plastic reinforced with carbon fibers is approximately $0.1 \times 10^{-6} K^{-1}$, is also considerably reduced. Furthermore, aromatic polyamide fiber with approximately 2830 N/mm has a clearly lower value for the tension stiffness per unit width than carbon fiber fabrics which is approximately 4100 N/mm. Accordingly, using the present invention the thermal stresses are considerably reduced. Moreover, it is also advantageous that aromatic polyamide fiber is not electrically conductive so that the polyimide sheeting does not have to act as electrical insulation. Therefore, the thickness of the polyimide sheeting can be reduced to less than half which affords a significant reduction in weight.

The weight of the carrier membrane can also be significantly reduced by limiting the surface coverage of the transversely extending bands of the fabric covering the plastic sheeting. The stretched direction of the membrane represents the direction between the two opposite sides in which the membrane is stretched. Stresses extend in the stretched direction and are inevitable because of the existing thermal expansion difference between the frame and the membrane. Accordingly, it is necessary to reinforce the plastic sheeting particularly in the stretched direction by means of the applied bands. The degree of surface coverage afforded by the bands extending in the stretched direction, that is, the proportion of the surface of the plastic sheeting covered by the bands extending in the stretched direction, may not be below a specific minimum value depending on the respective load. The extent of the surface coverage by the bands extending transversely of the stretched direction may be considerably lower. Assuming that bands of equal width are used, the bands extending in the stretched direction can be placed practically next to one another, while the bands extending transversely of the stretched direction can be spaced much further apart. Contrary to this arrangement of the bands, the reinforcing fabrics used up until the present time had the bands spaced apart uniformly in both directions. The reduction in the number of transverse bands in accordance with the present invention and the reduction in the surface coverage related to the bands extending in the transverse direction results in a corresponding additional reduction in weight.

The term "surface coverage" serves also to explain that the band strength is to be considered so that at the same band width and spacing, the surface coverage increases proportionally with increasing band thickness.

Originally there were considerable doubts about the use of aromatic polyamide fibers in accordance with the present invention, because it was believed that the material properties would experience an unallowable degradation under space conditions, particularly due to UV radiation. It was assumed that the polymer structure of the aromatic polyamide fiber would decompose under the effects of radiation and would result in a reduction of the mechanical strength of the fiber to an unacceptable level. Contrary to these expectations, however, it has been found that these effects did not take place to the extent anticipated comparable to the radiation conditions which prevail in earth orbit, if the side of the polyimide sheeting, facing away from the radiation, is covered with fabric formed of plastic reinforced with aromatic polyamide fibers.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described preferred embodiments of the invention.

BRIEF DESCRIPTION OF THE DRAWING

In the drawing two embodiments of the invention are illustrated wherein.

DETAIL DESCRIPTION OF THE INVENTION

Figure 1:
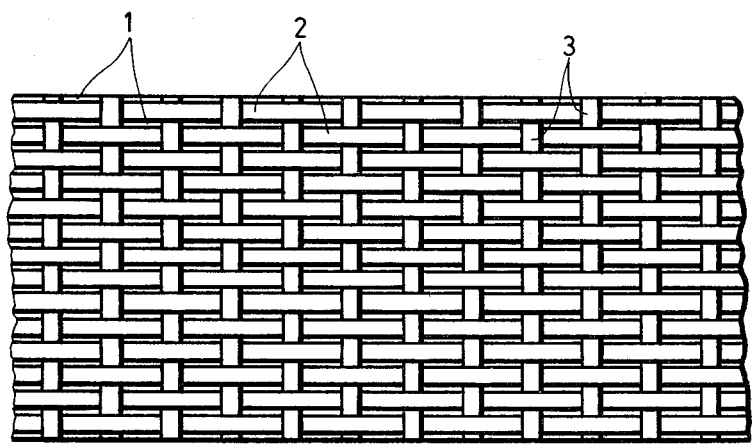
FIG. 1 is a plan view of a portion of a carrier membrane formed of bands of equal width extending at right angles to one another.
Figure 2:
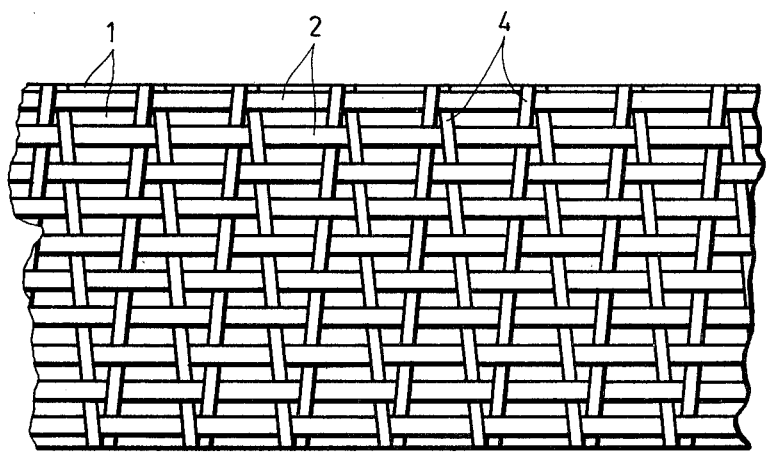
FIG. 2 is a plan view of a carrier membrane with the bands being of unequal width with the bands extending transversely of the stretched direction oriented at an oblique angle to the bands disposed in the stretched direction.

In the drawing, the frame, preferably rectangular, on which the carrier membrane is stretched, is not shown in either embodiment. In each of FIGS. 1 and 2 the stretched direction of the membrane is in the left to right direction. On plastic sheeting 1, preferably a polyimide sheeting, a fabric composed of fiber-reinforced plastic is applied, preferably by gluing. In FIG. 1, the fabric is made up of interwoven bands 2 and 3. The bands 2 and 3 are of equal width with the bands 2 extending in the stretched direction of the carrier membrane and with the bands 3 extending perpendicularly to the bands 2. In FIG. 2, the bands 2 extend in the stretched direction and the bands 4 extending transversely of the bands 2 have a smaller width and while extending transversely of the bands 2 they also extend obliquely of the bands 2. The bands 2, 3 and 4 are formed of plastic reinforced with aromatic polyamide fibers sometimes called polyarylamide and also known as KEVLAR. As illustrated by the two figures in the drawing, there are possible variations within the scope of the invention relative to the width of the bands as well as to their spacing and direction. In addition to the material used, it is important that the degree of surface coverage by the bands extending across the stretched direction is less than that of the bands extending in the stretched direction. In FIG. 1 the degree of surface coverage of the bands 2 is approximately 0.75 while that of the bands 3 is approximately 0.3. The extent to which the surface coverage of the bands 2 extending in the stretched direction exceeds that of the surface coverage of the bands 3 extending transversly of the bands 2, is characterized by a factor of 2.5. In FIG. 2, the degree of surface coverage of the bands 2 is approximately 0.5 while that of the bands 4 is approximately 0.25 resulting in a factor of approximately 2.0. Basically this factor should be as high as possible making a compromise between the decreasing weight and the simultaneously decreasing strength of the membrane.

In FIG. 2 there are two groups of bands 4. Each group of bands 4 extends transversely of the band 2. In each group the bands 4 are in parallel relationship and are spaced laterally apart. The bands 4 in one group extend obliquely of the bands 4 in the other group.

While specific embodiments of the invention have been shown and described in detail to illustrate the application of the inventive principles, it will be understood that the invention may be embodied otherwise without departing from such principles.

We claim:

1. Solar cell carrier membrane arranged to be stretched in a frame between two opposite sides with the direction between the two opposite sides defining the first direction of the membrane and the direction extending substantially perpendicularly of the first direction defining the second direction of the membrane, the membrane comprises plastic sheeting extending in the first and second directions and a fabric of woven bands extending transversely of one another located on the surface of said plastic sheeting, said bands forming said fabric are made of a fiber-reinforced plastic material, said bands comprising first bands and second bands said first bands extending in the first direction in generally parallel relation and spaced laterally apart from one another and said second bands extending transversely of said first bands and spaced laterally apart from one another, said first bands providing greater surface coverage of said plastic sheeting than said second bands, and said first and second bands are made of plastic reinforced with aromatic polyamide fibers.

2. Solar cell carrier membrane as set forth in claim 1, wherein said second bands extend perpendicularly of said first bands and in the second direction of the carrier membrance.

3. Solar cell carrier membrane, as set forth in claim 2, wherein said first bands and said second bands each having the same width dimension with adjacent said first bands being located closer together than adjacent said second bands.

4. Solar cell carrier membrane, as set forth in claim 3, wherein said first bands cover approximately 75% of said plastic sheeting and said second bands cover approximately 30% of said plastic sheeting.

5. Solar cell carrier membrane, as set forth in claim 1, wherein said second bands extending transversely of said first bands are disposed obliquely of said first bands.

6. Solar cell carrier membrane, as set forth in claim 5, wherein said second bands arranged in two groups with the bands in each group extending in parallel relation and with said bands in each group extending obliquely to the bands in the other said group.

7. Solar cell carrier membrane, as set forth in claim 5, wherein said first bands have a greater width than said second bands.

8. Solar cell carrier membrane, as set forth in claim 7, wherein the spacing between said first bands being considerably less than the spacing between said second bands.

9. Solar cell carrier membrane, as set forth in claim 8, wherein said first bands cover approximately 50% of the surface of said plastic sheeting and said second bands cover approximately 25% of the surface of said plastic sheeting.

10. Solar cell carrier membrane, as set forth in claim 1, wherein said fabric being located on and adhered to only one surface of said plastic sheeting.

11. Solar cell carrier membrane, as set forth in claim 1, wherein said plastic sheeting is a polyimide sheeting.

* * * * *